(12) United States Patent
Hsing et al.

(10) Patent No.: US 8,169,801 B2
(45) Date of Patent: May 1, 2012

(54) VOLTAGE CONVERTERS WITH INTEGRATED LOW POWER LEAKER DEVICE AND ASSOCIATED METHODS

(75) Inventors: Michael R. Hsing, Saratoga, CA (US);
Ognjen Milic, San Jose, CA (US);
Tiesheng Li, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 385 days.

(21) Appl. No.: 12/474,037

(22) Filed: May 28, 2009

(65) Prior Publication Data

US 2010/0302810 A1   Dec. 2, 2010

(51) Int. Cl.
*H02M 3/335* (2006.01)
(52) U.S. Cl. .................... 363/21.16; 327/112
(58) Field of Classification Search ............ 363/16–20, 363/21.04, 21.08, 21.12, 49, 56.03, 97, 98, 363/131; 307/26, 31, 41, 142, 143; 327/310, 327/390, 544, 545, 584, 112, 377, 374, 143; 257/723, E25.029, 368
See application file for complete search history.

(56) References Cited

U.S. PATENT DOCUMENTS

| | | | | |
|---|---|---|---|---|
| 5,014,178 A | * | 5/1991 | Balakrishnan | 363/49 |
| 5,285,369 A | * | 2/1994 | Balakrishnan | 363/49 |
| 5,477,175 A | * | 12/1995 | Tisinger et al. | 327/143 |
| 5,517,397 A | * | 5/1996 | Quek et al. | 363/21.16 |
| 5,663,672 A | * | 9/1997 | Nuechterlein | 327/374 |
| 6,940,320 B2 | * | 9/2005 | Sukup et al. | 327/112 |
| 7,440,777 B2 | * | 10/2008 | Karaoguz et al. | 455/561 |
| 7,782,637 B2 | * | 8/2010 | Selgi et al. | 363/49 |

* cited by examiner

*Primary Examiner* — Rajnikant Patel
(74) *Attorney, Agent, or Firm* — Perkins Coie LLP (57) ABSTRACT

Voltage converters with integrated low power leaker device and associated methods are disclosed herein. In one embodiment, a voltage converter includes a switch configured to convert a first electrical signal into a second electrical signal different than the first electrical signal. The voltage converter also includes a controller operatively coupled to the switch and a leaker device electrically coupled to the controller. The controller is configured to control the on and off gates of the switch, and the leaker device is configured to deliver power to the controller. The leaker device and the switch are formed on a first semiconductor substrate, and the controller is formed on second semiconductor substrate separate from the first semiconductor substrate.

20 Claims, 12 Drawing Sheets

VOLTAGE CONVERTERS WITH INTEGRATED LOW POWER LEAKER DEVICE AND ASSOCIATED METHODS

TECHNICAL FIELD

The present invention relates to semiconductor devices useful in voltage converters, and more particularly to semiconductor devices useful in AC/DC voltage converters.

BACKGROUND

For power supply devices such as a DC-DC (direct current to direct current) converter or AC-DC (alternating current to direct current) converter, the size of the device and its cost are two important considerations for its application. A converter usually includes at least one controller with certain external components. It is desired that minimum or ideally no external components are necessary to build the converter as well as to reduce the manufacturing cost of the controller portion of the converter.

Figure 1:
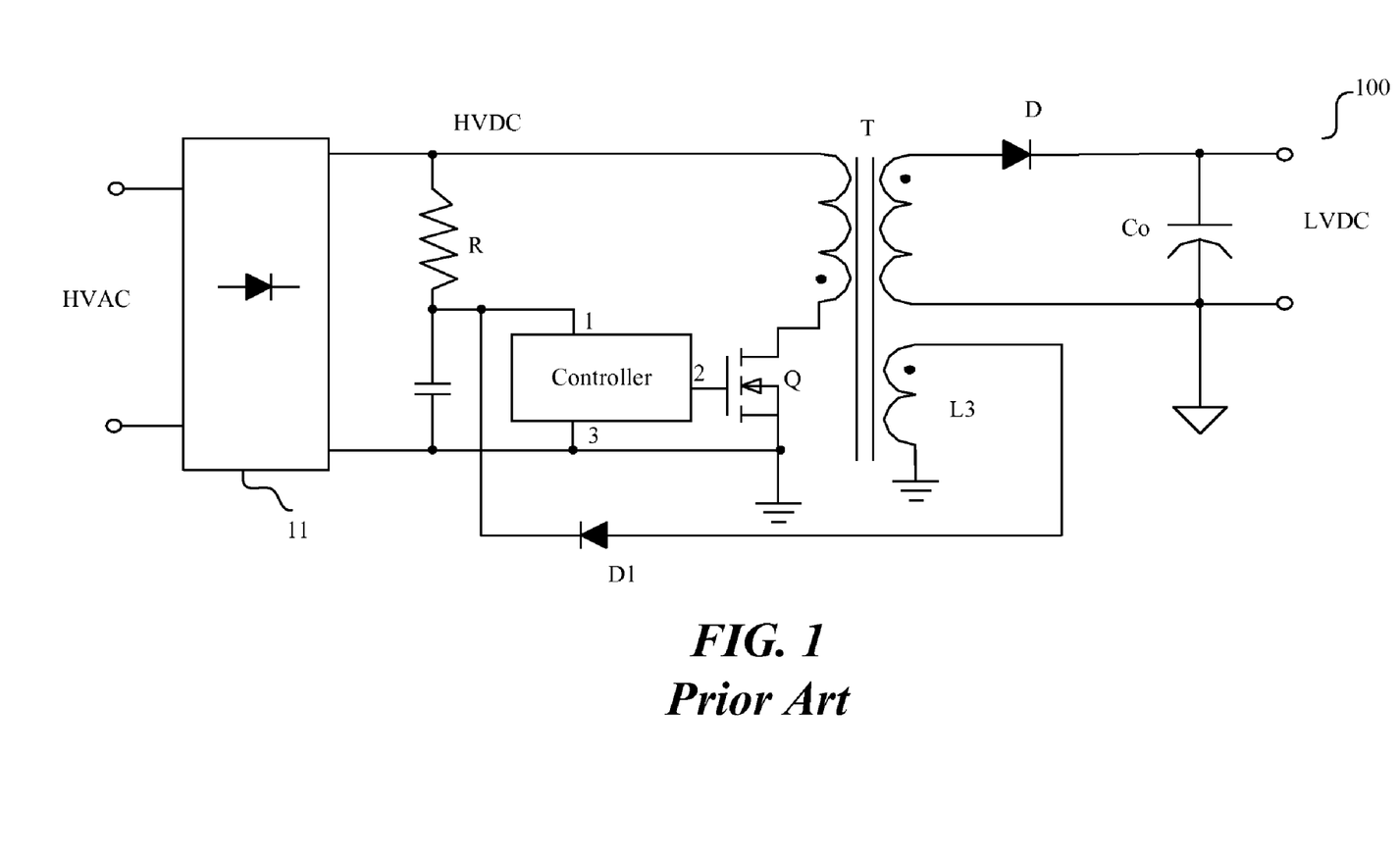
FIG. 1 is a schematic diagram showing a topology of an AC-DC converter in accordance with the prior art.

FIG. 1 illustrates a schematic topology of a conventional off-line converter. As shown in FIG. 1, the converter comprises (1) a rectifier 11 to convert the high AC line voltage (HVAC) into DC line voltage (HVDC) and (2) a DC-DC converter to convert the HVDC into a low DC voltage (LVDC) with typically one controller. The off-line converter is designed to be a switch-mode voltage converter, such as the 110 VAC-3.6 DC battery charger for portable electronics. As seen, HVAC is rectified by the rectifier 11 and delivers the line voltage of HVDC. The DC-DC converter in FIG. 1 uses a flyback converter which converts the HVDC into a low AC voltage through the transformer T with the periodical turn-on and turn-off of the switch Q. The low AC voltage is rectified by D and filtered by Co into a low DC voltage LVDC which supplies the load such as a battery. The switching of Q is controlled by the controller.

In operation where the DC-DC converter functions normally, the controller is powered from the DC-DC converter, typically from an auxiliary winding L3 shown in FIG. 1 with a low DC voltage rectified by a rectifier D1. However, during startup of the converter, before the onset of the switching action of the switch Q, there is no power delivered from the auxiliary winding L3, and the switch Q enters into normal function only after the controller is powered and controls Q. One traditional approach to power the controller before normal operation is to get power from the high line voltage HVDC through a voltage divider comprising two resistors. HVAC can be 110 VAC, 220 VAC or other levels in applications, thus the rectified HVDC can reach up to about 700V in some applications. HVDC itself is too high to power the low voltage controller thus it needs a leaker device to reduce the voltage and to form a low current source first, such as adopting a resistor R with high value to divide the HVDC line voltage. But this approach needs extra component of high resistor R which increases the size and the cost of the system. For that reason, it is desirable to introduce a current leaker or, as formally called, a current source to supply the startup power. While it is possible to include a HV leaker device on the same substrate as a low-voltage controller, such inclusion requires expensive high-resistance substrates as well as several more masking stages in the process of manufacture, thus increasing the costs of the controller.

DETAILED DESCRIPTION

Various embodiments of voltage converters and associated methods of manufacturing are described below. The phrase "normal switching operation" or "normal operation of switch" generally refers to the standard operation that occurs when a power switch enters into normal alternating on and off switching function while the controller is powered by a circuit generating current from the switching function after startup. The phrase "leaker device" generally refers to a current bias device configured to deliver start-up power. The phrase "high voltage" generally refers to voltages above about 100 volts. The phrase "A is connected to B" generally refers to A and B (e.g., may each include a node, a device terminal, a port, and/or other suitable connection point) being electrically connected to each other by a conductive structure so that for frequencies within a signal bandwidth of interest, the resistance, capacitance, and inductance introduced by the conductive structure may each be neglected. The phrase "A is coupled to B" generally refers to (1) A and B being connected to each other, or (2) although A and B may not be connected to each other, there is a device or circuit that is connected to both A and B so that a properly defined voltage or current at one of A and B has some effect on a properly defined voltage or current at the other. A person skilled in the relevant art will also understand that the systems and/or methods disclosed herein may have additional embodiments and that the systems and methods disclosed herein may be practiced without several details of the embodiments described below with reference to FIG. 2-11.

Figure 2:
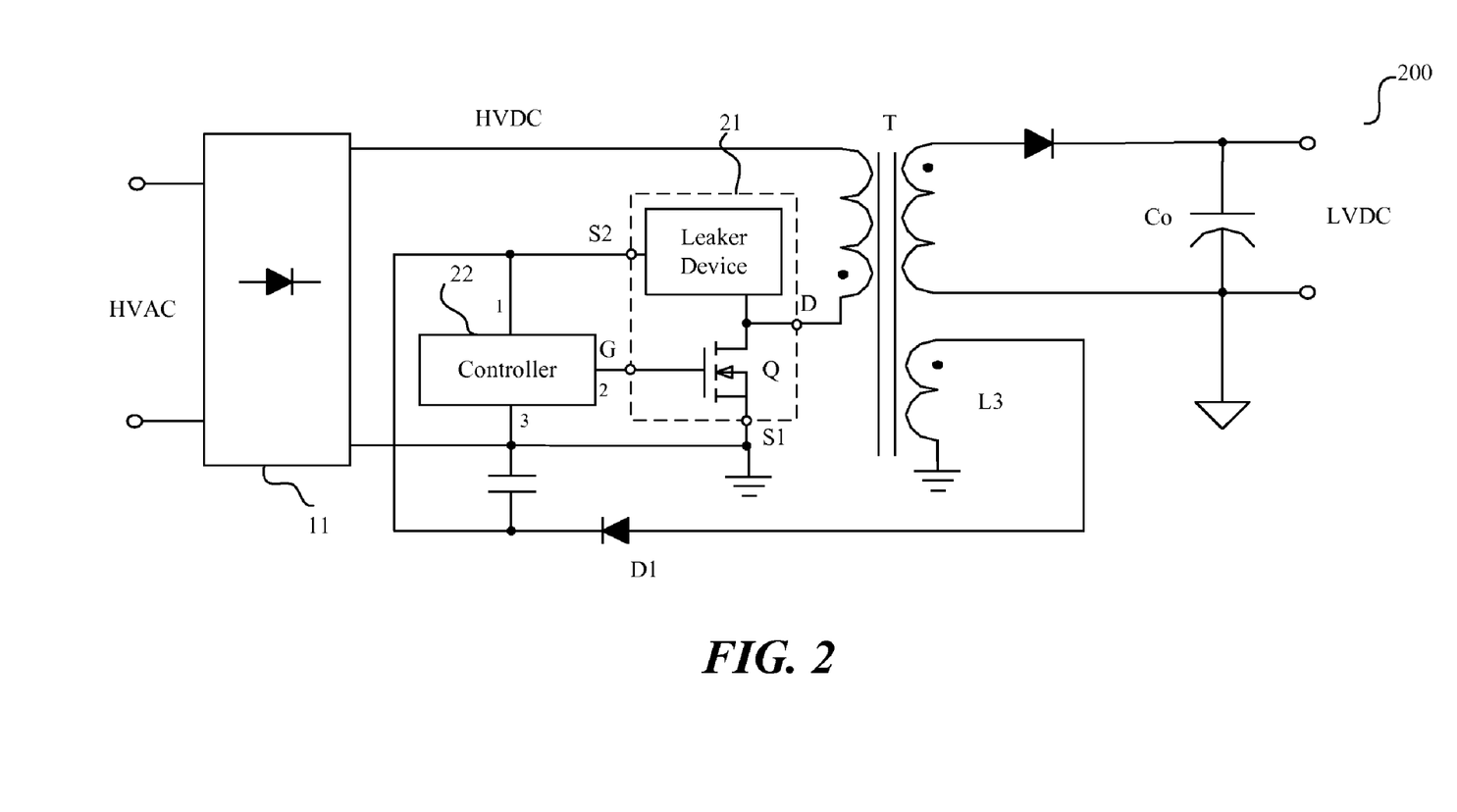
FIG. 2 is a schematic diagram showing a topology of a voltage converter in accordance with embodiments of the disclosure.

FIG. 2 shows a schematic topology of an off-line converter 200 in accordance with embodiments of the disclosure. The converter 200 includes a leaker device and a switch Q built on one semiconductor substrate and a controller built on another semiconductor substrate. The off-line converter 200 includes a rectifier 11 configured to convert a high AC voltage HVAC into a high DC voltage HVDC. The off-line converter 200 also includes other parts of a DC-DC converter (e.g., a flyback transformer).

In one embodiment, building the leaker device and the switch Q on one semiconductor substrate while the controller is built on another semiconductor substrate is used in a DC-DC converter. The DC-DC converter in FIG. 2 comprises a main circuit having a switch Q which converts the DC line voltage into a first alternating signal with the turn-on and turn-off of Q, a transformer T which converts the first alternating signal into a second alternating signal of lower amplitude, a rectifier D and a filter Co that convert the second alternating signal into a low DC voltage (LVDC). The DC-DC converter further comprises a controller 22 that controls the gate of the switch Q at pin 2, an auxiliary winding L3 that delivers DC power to the controller 22 through rectifier D1 at pin 1 during normal operation of Q, and a leaker device that delivers DC bias power to the controller 22 at pin 1 before the normal operation of Q during the startup. The controller 22 further receives other signals (not shown in FIG. 2 for clarity) to control the switch Q. In this embodiment, the leaker device and the switch Q are built on the same semiconductor substrate, and thus the leaker device and the switch Q compose the semiconductor device 21.

In the illustrated embodiment, the semiconductor device 21 comprises external terminals of D, S1, S2 and G. Terminal D is connected to one end of the primary winding L1 where the leaker device and Q share the same terminal D, and the other end of L1 is connected to the input voltage of HVDC. During startup, the switch Q does not switch with the working frequency, and the voltage at terminal D substantially equals to HVDC. In another embodiment, the semiconductor device further comprises an external terminal that connects the drain of the leaker device directly to the line voltage HVDC which is at the high end of the primary winding L1 as shown in FIG. 2 and is separate from the drain of the switch Q. Terminal S1 is the source of the switch Q. Terminal G is the gate of Q and is connected to pin 2 of the controller 22 to be controlled by the controller 22. Terminal S2 is connected to the leaker device and supplies the controller through pin 1 during the startup of the converter. S1 and S2 are distinct terminals. The substrate for the semiconductor device 21 is sustainable for a higher voltage than the substrate on which the controller 22 is built. Accordingly, the semiconductor device 21 uses the high-resistance semiconductor substrate for high voltage while the controller is built on a normal semiconductor substrate for low voltage. With this configuration, the semiconductor device 21 acts as the startup power supply for the controller 22 where the leaker device generates low bias current from the high DC voltage to the controller 22. After the normal switching starts, the semiconductor device 21 continues to act in its primary role as a power switch with Q.

Figure 3:
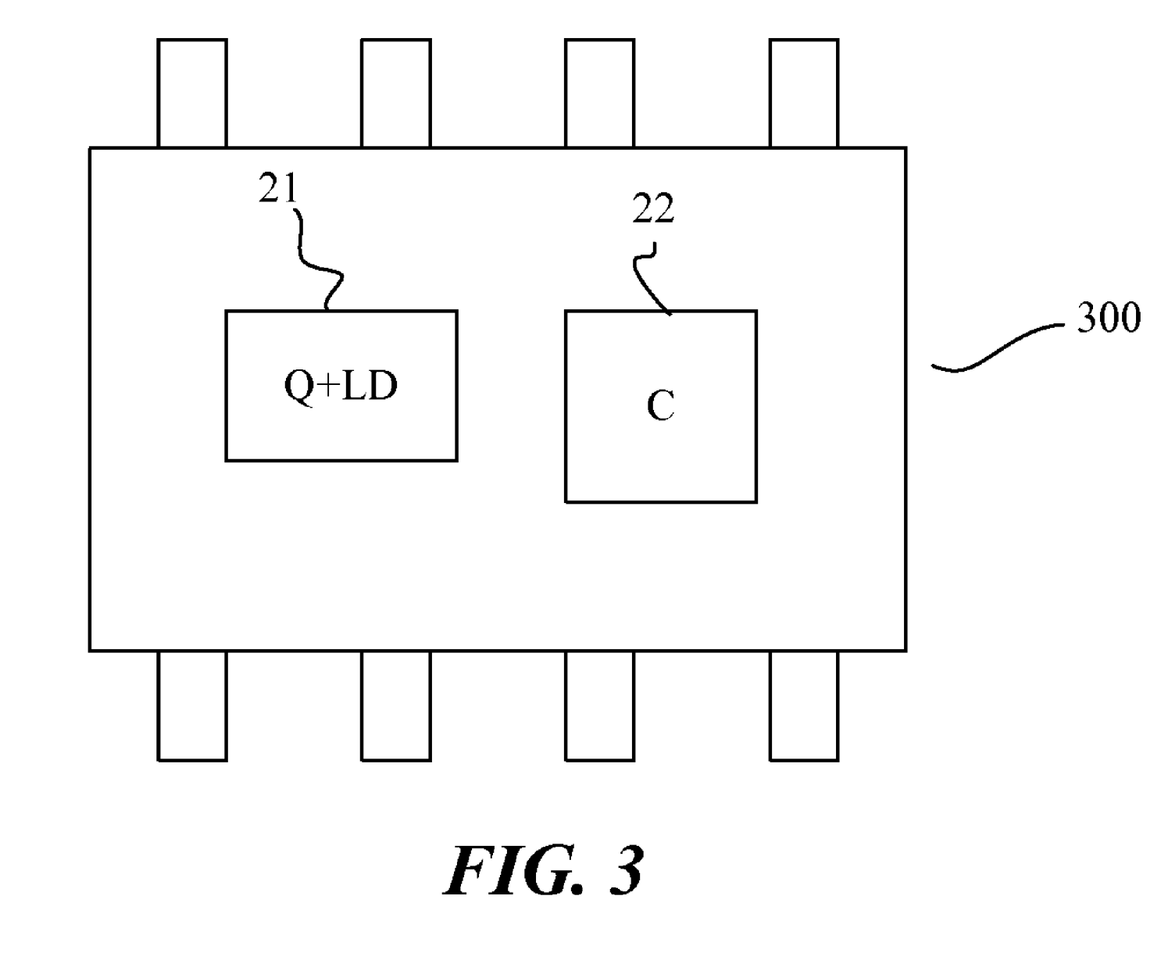
FIG. 3 is a top plane view of a package integrating a semiconductor device and a controller in accordance with embodiments of the disclosure.

FIG. 3 shows a top plane view of a package 300 in which the semiconductor device 21 and the controller 22 are encapsulated in an encapsulant in accordance with embodiments of the disclosure. In the illustrated embodiment, the semiconductor device 21 comprises the switch Q and the leaker device LD on the same semiconductor substrate as one bare chip. The controller C is built on another separate chip. This dual-chip module package can reduce the size of the converter system. In other embodiments, the semiconductor device 21 and the controller 22 may be packaged in other arrangements.

Figure 4A:
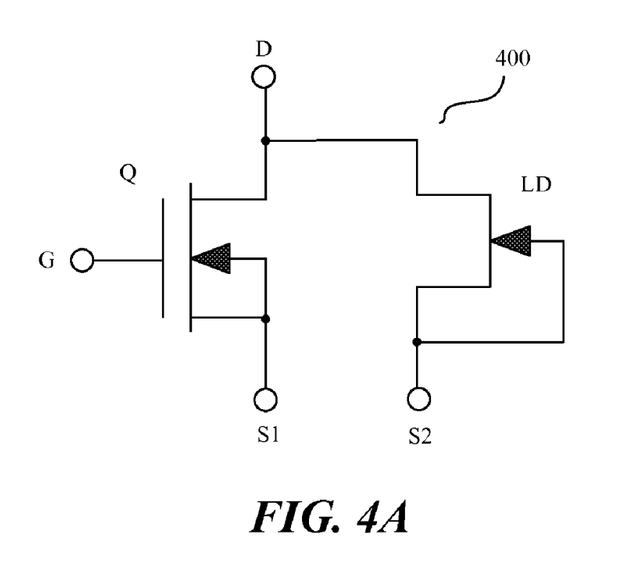
FIG. 4A illustrates a semiconductor device having a junction gate field-effect transistor (JFET) with shorted gate and source and metal-oxide-semiconductor field-effect transistor (MOSFET) in accordance with embodiments of the disclosure.
Figure 4B:
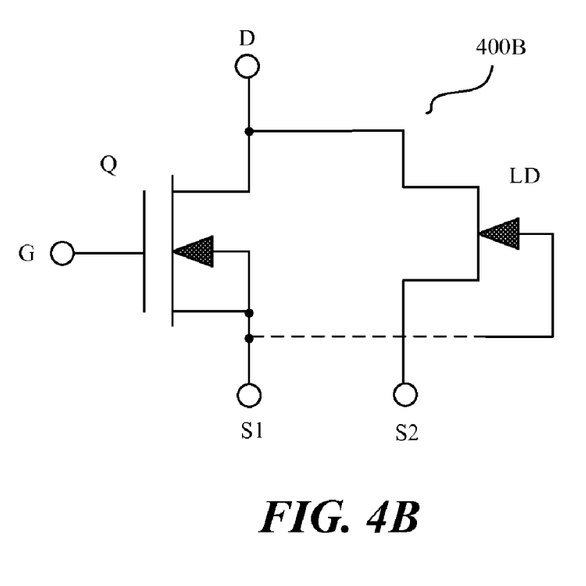
FIG. 4B illustrates a semiconductor device having a JFET with floating gate and MOSFET in accordance with embodiments of the disclosure.

FIG. 4A and FIG. 4B illustrate one type of a semiconductor device 400 that includes a MOSFET Q as the switch and a JFET LD as a leaker device in accordance with embodiments of the disclosure. In the semiconductor device, the N-type MOSFET Q has a gate G, a drain D, and a source S1. S1 is connected to the body of Q. In one embodiment, the N-type JFET LD has its gate connected to its source S2 as illustrated in FIG. 4A. In another embodiment, the gate of N-type JFET device is floating nominally which is not connected to its source as illustrated in FIG. 4B. When the drain bias is high, it is believed that a conducting path is formed between the gate of LD and the source of Q, as n-type semiconductor under the gate of double-diffused metal-oxide-semiconductor (DMOS) becomes inverted into the p-type as illustrated below. For both the semiconductor devices (400 and 400B) in FIG. 4A and FIG. 4B, the drain of the MOSFET and the drain of the JFET are connected together to share the same drain D. During startup, G is low and the MOSFET is in off state. As there is no AC signal in the primary side, the voltage at terminal D equals the line voltage HVDC. LD is in on state. Current is generated through the JFET LD from terminal D to S2 to supply the controller. When the controller is fully powered, Q enters into normal operation with alternating high and low gate driving signal from the controller at terminal G and the auxiliary winding takes over to deliver power to the controller.

Figure 5:
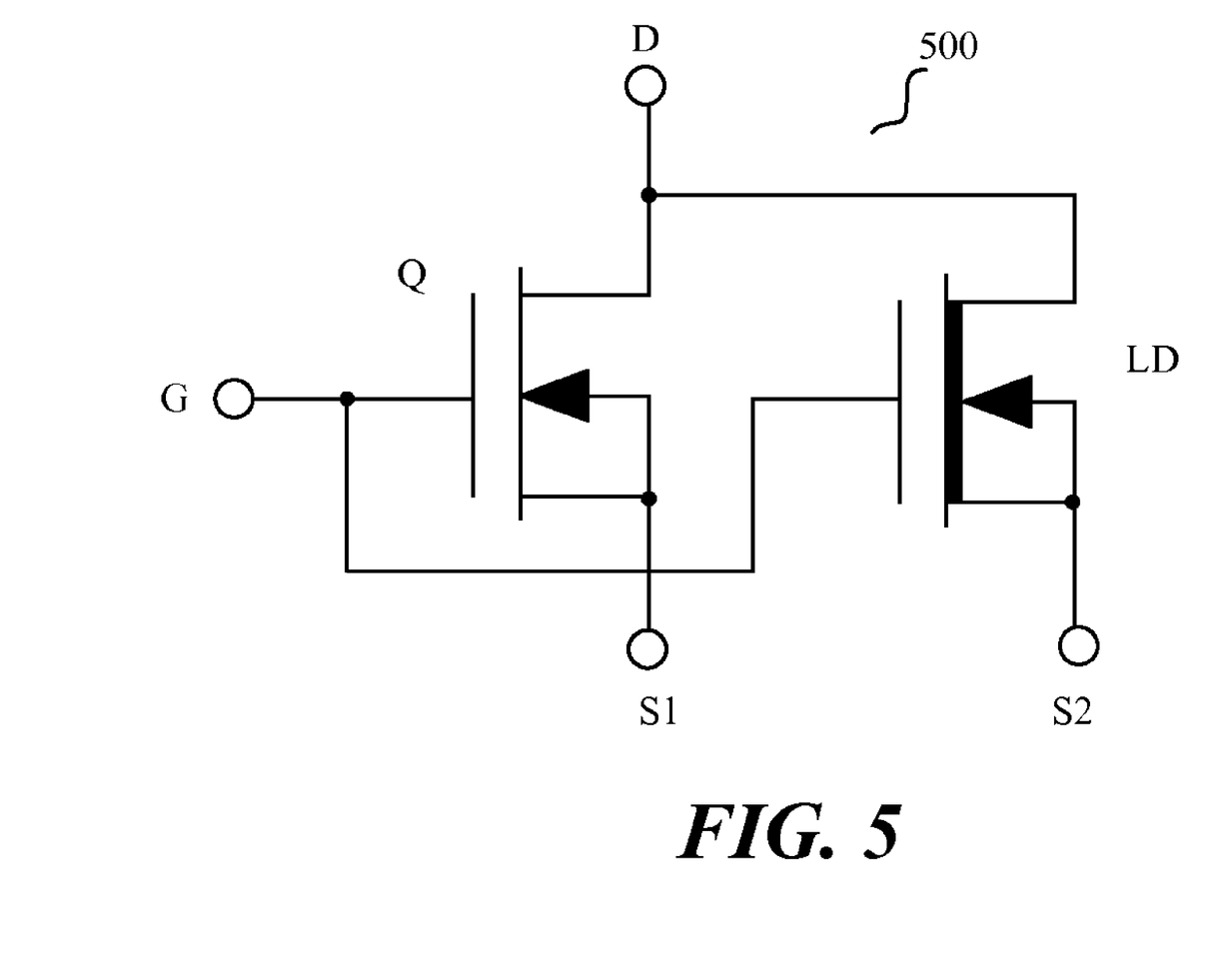
FIG. 5 illustrates a semiconductor device having two different types of MOSFET in accordance with embodiments of the disclosure.
Figure 6A:
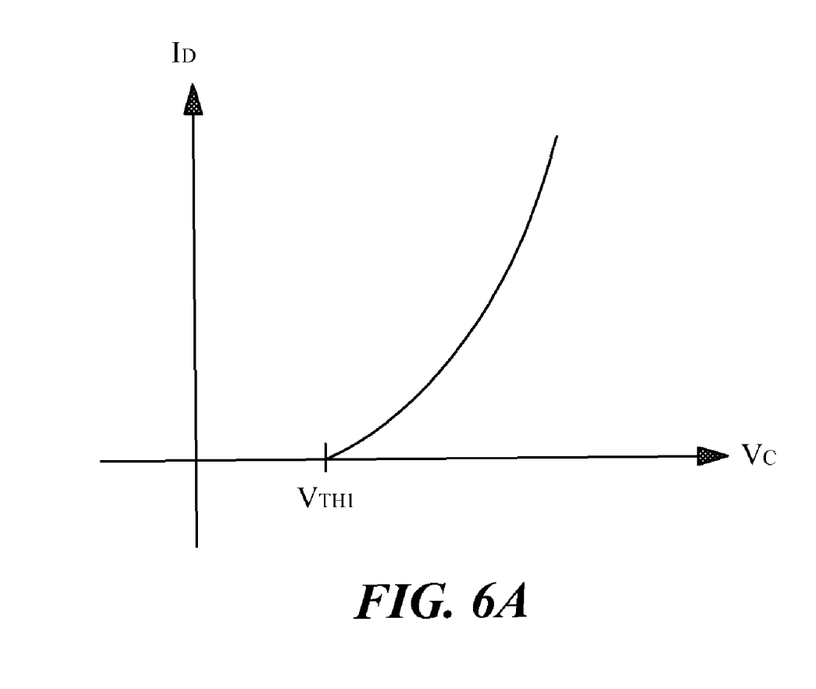
FIG. 6 illustrates voltage-current characteristic diagrams of an enhancement mode MOSFET and a depletion mode MOSFET in accordance with embodiments of the disclosure.
Figure 6B:
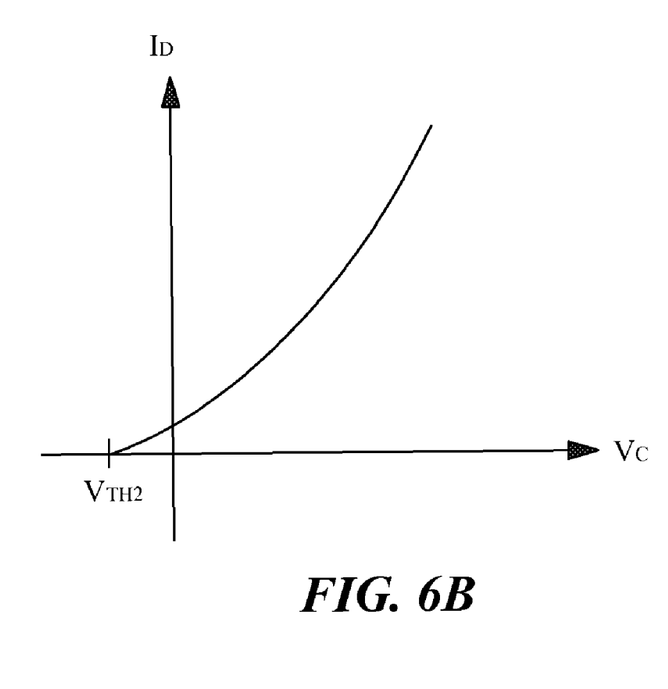

FIG. 5 shows another type of semiconductor device 500 having a MOSFET Q as the switch Q and another MOSFET LD as the leaker device in accordance with embodiments of the disclosure. In this semiconductor device, the threshold voltage of Q is higher than that of LD which can be seen in FIG. 6A and FIG. 6B. The gates of Q and LD are connected at terminal G, controlled by the controller. The drains of Q and LD are connected at terminal D. MOSFET Q has the source S1 and MOSFET LD has a separate source S2. Now referring to FIG. 6A, MOSFET Q is of enhancement mode where the threshold voltage $V_{TH1}$ is of positive value. In one embodiment, $V_{TH1}$ is about 2 Volts. Referring to 6B, MOSFET LD is of depletion mode where the threshold voltage $V_{TH2}$ is of negative value. In one embodiment, $V_{TH2}$ is about −0.05 Volts. During the startup of the converter, the voltage at G is at about zero voltage, MOSFET Q is in off state and MOSFET LD is in on state, thus, the line voltage generates bias current flowing through D to S2 which is used to supply the controller. After the controller is fully powered and starts up switching, the other part of the converter such as the auxiliary winding takes initiative to supply the controller.

The MOSFET Q as described in FIG. 4A and FIG. 4B can include a Vertical-Double-Diffused Metal-Oxide-Semiconductor (VDMOS) and the JFET LD can include a Vertical Junction-Field-Effect Transistor (JFET). Both the MOSFET Q and the JFET LD can be fabricated on a high-resistance semiconductor substrate having an epitaxial layer. The MOSFET Q and MOSFET LD in FIG. 5 can include both VDMOS devices with different channel dopant concentrations fabricated on a high-resistance semiconductor substrate, including an epitaxial layer. The VDMOS device comprises multiple parallel connected VDMOS cells having the same structure, and the JFET device comprises multiple identical parallel connected JFET cells.

In certain embodiments, the JFET LD and the MOSFET LD can be fabricated with certain modifications to the basic VDMOS process flow. In order to illustrate the process flow and the structure of the integrated semiconductor device 400 and 400B, a process flow of a standard VDMOS device is described below. One example structure of a VDMOS semiconductor device is shown in FIG. 7A with its symbol shown in FIG. 7B.

Figure 7A:
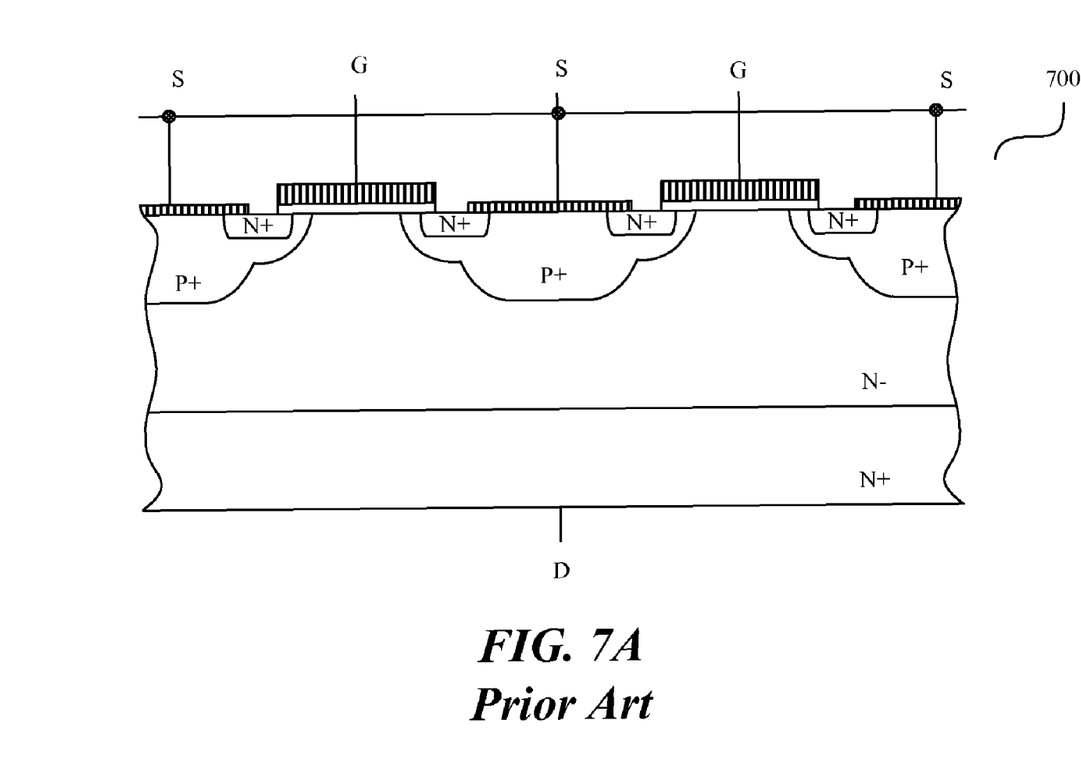
FIG. 7A and FIG. 7B illustrate a structure and a symbol of a standard vertical double-diffused metal-oxide-semiconductor (VDMOS) device in accordance with the prior art, respectively.
Figure 7B:
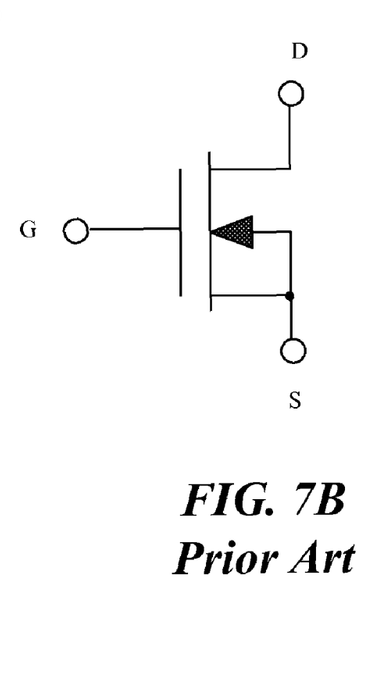

As seen in FIG. 7A, on the semiconductor substrate, multiple identical VDMOS cells are situated. Each VDMOS cell has a source S, a gate G and the drain D, and the cells are connected in parallel to form the gate G, the source S and the drain D of the VDMOS device as shown in FIG. 7B. Now referring back to FIG. 7A, on the highly doped N-type (N+) substrate, a low doped N-type (N−) epitaxial layer with high resistance is formed. The N+ substrate acts as the common drain D of all the cells. On the N− layer, double diffused P+ regions are formed to act as the body. In the P+ regions, N+ regions are formed to act as the source of the cells. The source and the body are electrically shorted by metal contacts 71. Gates are formed above the channel of the adjacent P+ regions and above the N− epitaxial region.

Figure 8:
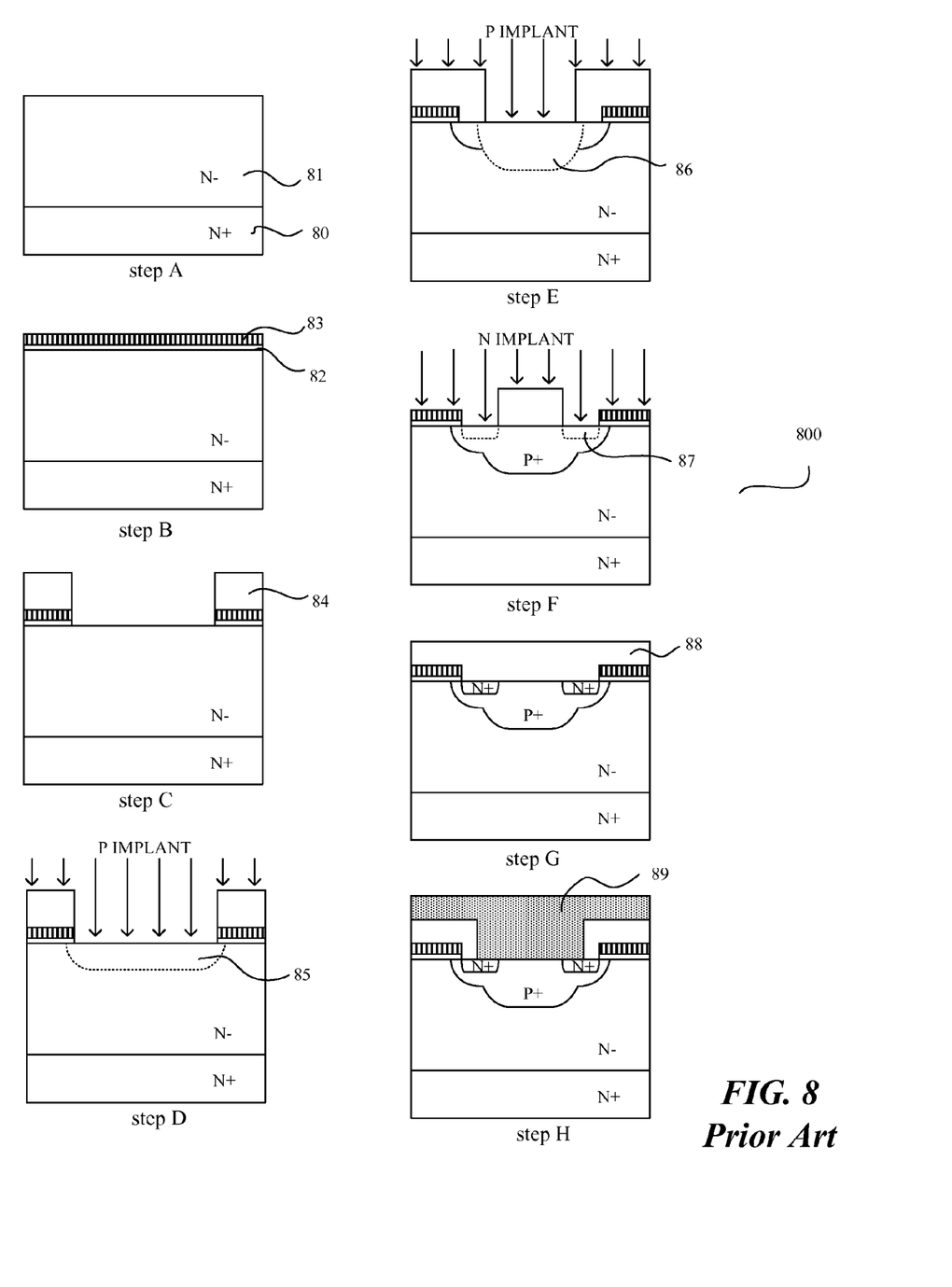
FIG. 8 illustrates a process flow of manufacturing a standard VDMOS device in accordance with the prior art.

The process flow of VDMOS 800 is illustratively shown in FIG. 8 with some stages omitted for clarity. In stage A, an epitaxial layer 81 of low N-type (N−) dopant is formed on the highly N doped (N+) substrate 80. In one embodiment, the N+ substrate 80 is doped with arsenic or antimony and the dopant concentration can be about $10^{20}$ cm$^{-3}$. The thickness and dopant concentration of the N− layer is selected for sustaining the high voltage applications. In one embodiment, the thickness of the N− layer is about 50 μm and the dopant concentration of it can be about $10^{14}$ cm$^{-3}$ when using phosphorous to dope the N− region. In stage B, a gate oxide layer 82 is grown on the surface of the N− layer 81 and heavily-doped polysilicon 83 is deposited on the gate oxide 82 layer to form the gate.

In stage C, photoresist 84 is deposited and photolithography is used to define the polysilicon gate pattern on the surface of the wafer. Photoresist 84 is then etched to create openings. In stage D, P-type dopant is implanted to the openings to form the P+ body regions 85. In stage E, photoresist is deposited and patterned with another mask to create the openings into which heavy P-type dopant (P+) is implanted. This second P-type body region 86 is believed to minimize the effect of the parasitic bipolar transistor inherent in the VDMOS structure.

After diffusion and activation of these layers, in stage F, the next photolithographic stage defines the source regions 87 of the VDMOS device with highly doped N-type (N+) with a source mask. After removal of the photoresist, the source doping is thermally diffused and activated. In stage G, the interlayer dielectric layer 88 is deposited, flattened and thermally reflowed. In one embodiment, the dielectric layer 88 adopts Boro-Phospho-Silicate Glass (BPSG). In stage H, a contact opening in inter-layer dielectric layer is defined using photolithography and metal 89 is deposited on the top of the cells. The contact opening is wide enough to achieve contact between the source 87 and the body 86, creating the electrical short between them.

Figure 9A:
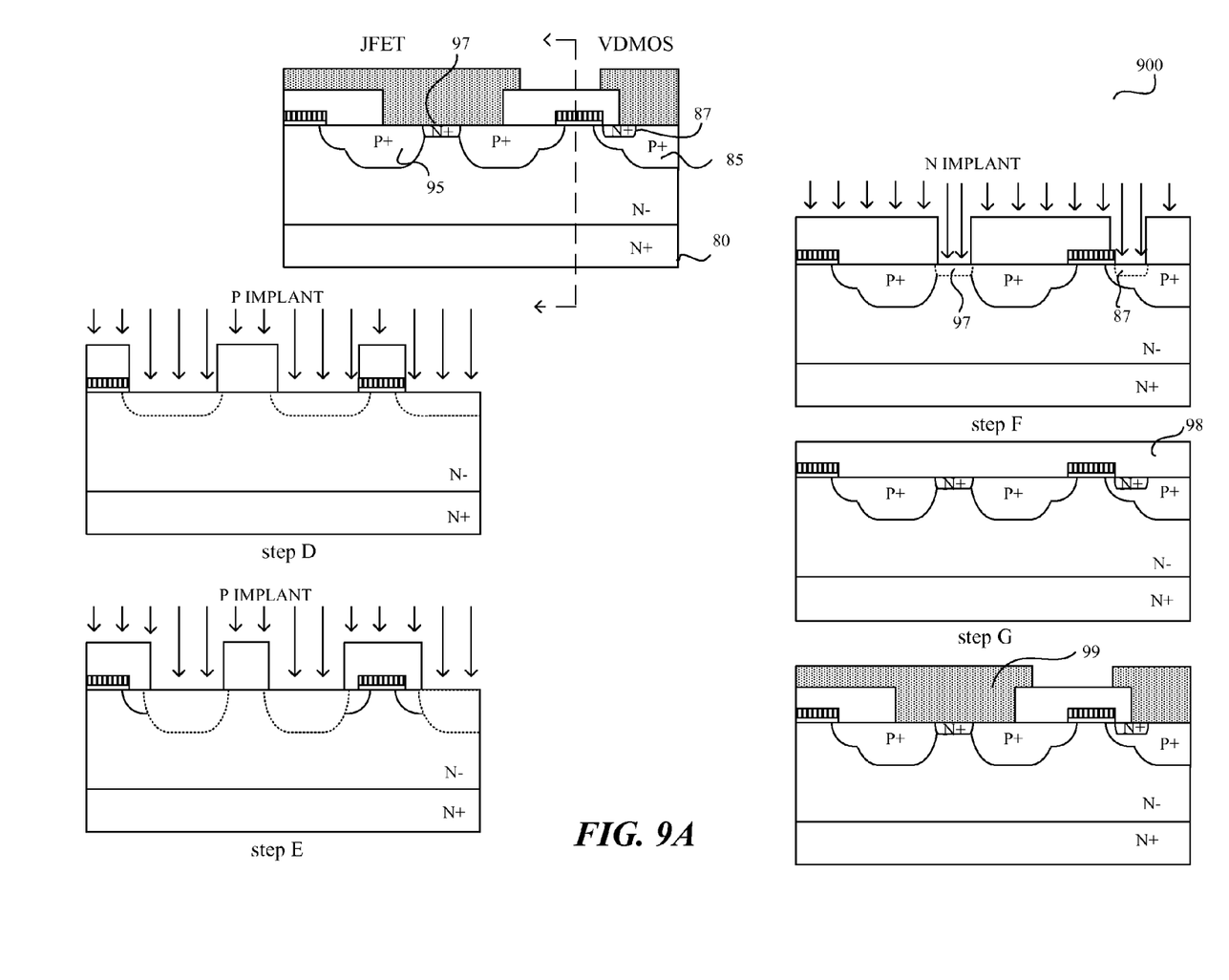
FIG. 9A illustrates a process flow for fabricating several embodiments of the semiconductor device shown in FIG. 4A in accordance with embodiments of the disclosure.
Figure 9B:
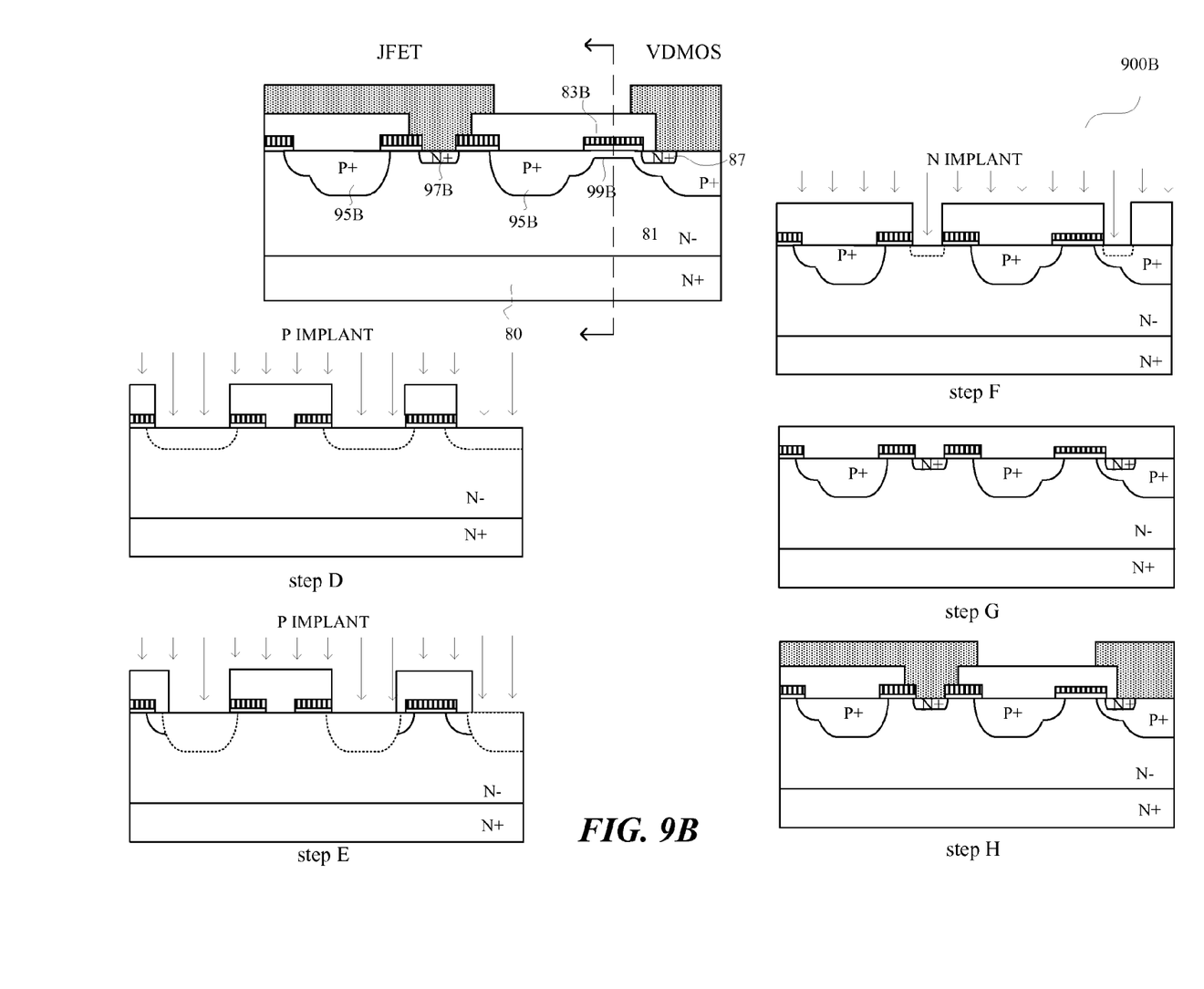
FIG. 9B illustrates a process flow for fabricating the semiconductor device shown in FIG. 4B in accordance with embodiments of the disclosure.

The semiconductor devices 400 and 400B can be fabricated with certain modification to the basic VDMOS process flow 800. The JFET cells and the VDMOS cells are fabricated on the same semiconductor substrate, or on the same die. The integration of a JFET device on a die does not add extra stages in accordance to the VDMOS process flow except only the patterns of the masks used for VDMOS cells are modified to shape both the VDMOS cells and the JFET cells. The source electrodes of JFET cells and VDMOS cells are separated by lithography to form two distinct electrodes. The sectional view and the fabrication of the semiconductor device 400 are shown in FIG. 9A in accordance with one embodiment. The sectional view and the fabrication of the semiconductor device 400B are shown in FIG. 9B in accordance with another embodiment. The semiconductor device 400 or 400B comprises parallel connected vertical JFET cells and parallel connected vertical DMOS cells.

For a JFET cell as shown in FIG. 9A, the P+ region 95 is at the periphery of the JFET cell with the central area left out to form the source 97 of the JFET cell. The P+ region 95 for JFET cell acts as the gate of JFET cell. The former stages of the process flow 900 remains the same as the standard VDMOS process flow 800. Starting with stage D, in order to build the JFET device, the pattern of the body mask for VDMOS as referred to in FIG. 8 is modified to define the gates of the JFET cells. After patterning the photoresist, implanting heavily doped P-type (P+) dopant into the openings at the gates region 95 of the JFET cells and the body regions 85 of the VDMOS cells. In stage E, implant the heavily doped P-type dopant at the gates region 95 of the JFET cells and the body regions 85 of the VDMOS cells twice as in stage E of process 800. In stage F, the sources 97 of the JFET cells and sources of the VDMOS cells are formed with modification to the source mask of the VDMOS device and is implanted with highly doped N-type dopant. In stage G and F, interlayer dielectric layer 98 is deposited and patterned with modification to the contact mask and then metal contacts 99 are formed and patterned. The contact openings are wide enough to achieve electrical shorts between the gates 95 and the sources 97 of the JFET cells, and also to achieve electrical shorts between the body regions 85 and sources of the VDMOS cells. The drains of the JFET device and the VDMOS device share a common N+ substrate layer, thus the drains of the JFET device and the VDMOS device are shorted internally as required in the semiconductor device as shown in FIG. 4A.

The sectional view of the semiconductor device 400B is shown in FIG. 9B. It comprises parallel connected vertical JFET cells and parallel connected VDMOS cells. The gates 95B of the JFET cells are separate from the sources 97B of the JFET cells. The gate 95B of the JFET cell is nominally floated which is not electrically connected to other parts. When the drain 80 is biased high, the upper thin layer of N-type epitaxial layer 81 under the gates 83B of the VDMOS cells is inverted into P-type, and there forms the electrically conducting paths between the gates 95B of the JFET cells and the abutting sources 85 of the VDMOS cells.

The process flow 900B of semiconductor device 400B does not add extra stages or masks to the process flow 800 of the standard VDMOS. Just as the semiconductor device described in FIG. 9A, only the patterns of the masks are changed to shape both the JFET cells and VDMOS cells of this semiconductor device 400B. Stages A-C are the same as those in the process flow 800. Starting with stage D, P-type dopant is implanted at the gate regions of the JFET cells and the body regions of the VDMOS cells. In stage E, P-type dopant is implanted twice at the gate regions of the JFET cells and the body regions of the VDMOS cells. In stage F, the source of the JFET cells and VDMOS cells are formed with N-type dopant implant. The sources of the JFET cells are separate from the gate of the JFET cells. In stage G, the inter-layer dielectric layer and metal contacts are formed and patterned.

Figure 10:
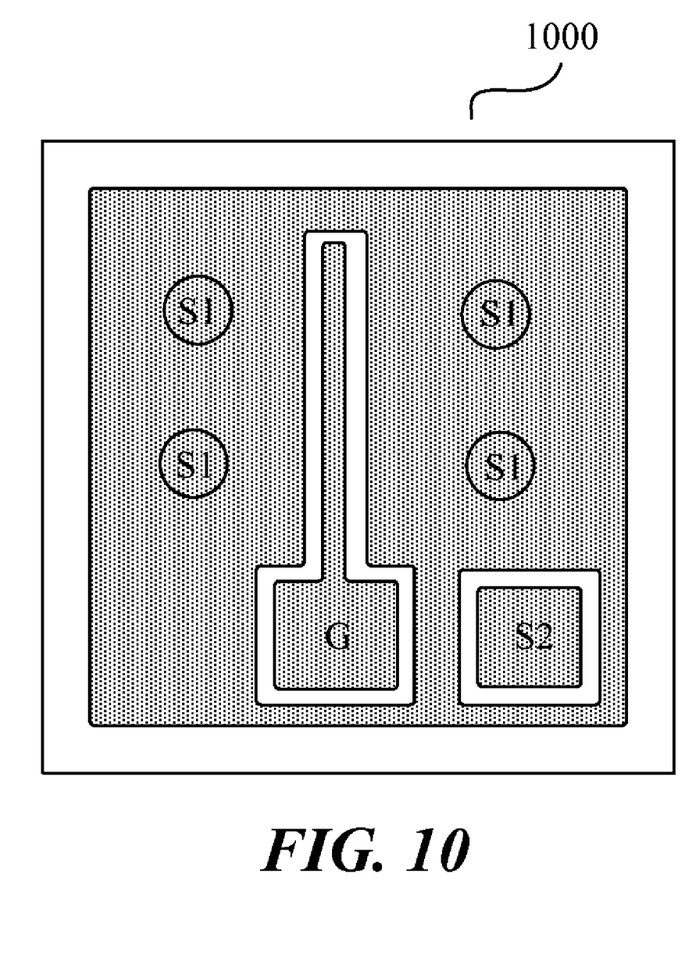
FIG. 10 illustrates a top plane view of a semiconductor device in accordance with embodiments of the disclosure.

The top view 1000 of the semiconductor device 400 or 400B comprising the VDMOS device and JFET device is shown in FIG. 10. At the top surface of the die, the gate of VDMOS device G, the source of VDMOS device S1 and the source of JFET device S2 are isolated from each other. The drain D is at the opposite side of the semiconductor device. The number of JFET cells on the die depends on the current necessary to be delivered for the startup of the controller. As the current flowing through the leaker device required for supply the low power controller is low compared to the current flowing through the switch, the number of the JFET cells is much less than that for the VDMOS cells in most applications.

Figure 11:
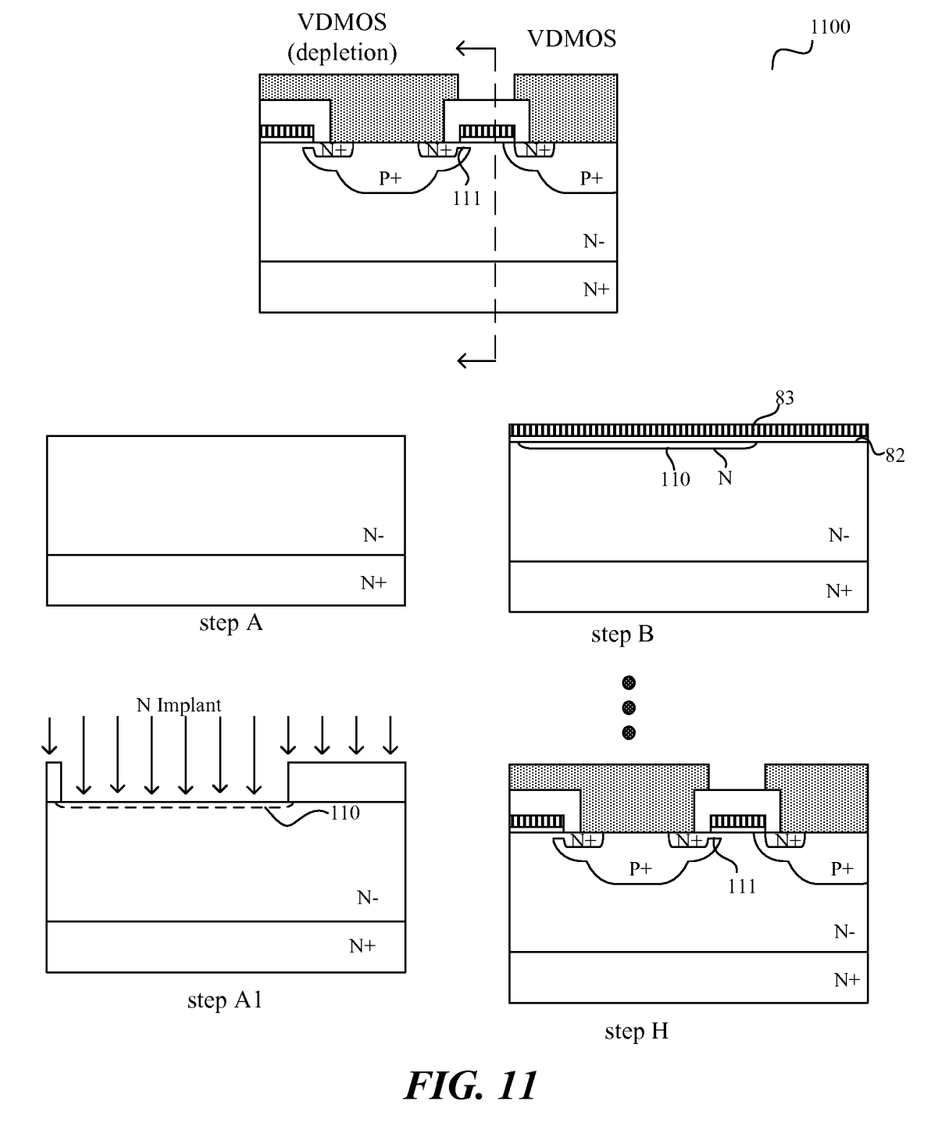
FIG. 11 illustrates a process flow for fabricating a VDMOS device with different channel dopant concentration in accordance with embodiments of the disclosure.

FIG. 11 shows the sectional view and schematic process flow 1100 of the semiconductor device 500. As shown in FIG. 11, the semiconductor device 500 comprises the enhancement mode VDMOS cells and the depletion mode VDMOS cells. The depletion mode VDMOS cells can be easily made by adding one more mask to the process 800 to change the channel 111 doping concentration. As seen in the process flow 1100, after stage A, an extra stage A1 is taken out using an extra mask before the formation of the gate oxide 82 and polysilicon 83 in stage B. For the depletion mode VDMOS cells, the extra mask is applied and high-energy N-type dopant is implanted into the channel 111 of the MOSFET LD. This N-type implantation 110 normally causes reduction of threshold voltage of the cell as this implantation doping counter dopes the body doping and the channel 111 dopant concentration is different from the rest VDMOS cells acting as the switch. The rest stages of the process flow 1100 are the same as in process flow 800. The top plane view of the semiconductor device comprising the enhancement mode VDMOS and the depletion mode VDMOS is similar to what is shown in FIG. 10. The current required to power the controller during startup determines the number of depletion mode VDMOS cells fabricated on the semiconductor device. As the current required for the leaker device is low compared to the current flowing through the switch, the number of the depletion mode VDMOS cells is much less than that for the enhancement mode VDMOS cells.

It should be known that the semiconductor devices described above can also adopt P-type MOSFET and P-type JFET where the P-type region is replaced with N doping and the N-type region is replaced with P doping referring to what is shown in FIG. 7A to FIG. 11.

From the foregoing, it will be appreciated that specific embodiments of the disclosure have been described herein for purposes of illustration, but that various modifications may be made without deviating from the disclosure. For example, many of the elements of one embodiment may be combined with other embodiments in addition to or in lieu of the elements of the other embodiments. Accordingly, the disclosure is not limited except as by the appended claims.

We claim:

1. A voltage converter, comprising: a switch configured to convert a first electrical signal into a second electrical; a switch configured to convert a first electrical signal into a second electrical signal different than the first electrical signal, the switch having alternating on and off gates; wherein the switch includes a MOSFET device;
    A controller operatively coupled to the switch, the controller being configured to control the on and off gates of the switch; and
    a leaker device electrically coupled to the controller, wherein the leaker device includes a JFET device with a nominally floating gate and wherein the drain of the switch and the drain of the leaker device are connected together, the leaker device being configured to deliver power to the controller, wherein the leaker device and the switch are formed on a first semiconductor substrate, and wherein the controller is formed on second semiconductor substrate separate from the first semiconductor substrate.

2. The voltage converter of claim 1, further comprising an encapsulant encapsulating the switch, the leaker device, and the controller into a same package.

3. The voltage converter of claim 1 wherein the first semiconductor substrate has higher resistance than the second semiconductor substrate.

4. The voltage converter of claim 1 wherein the switch includes a MOSFET device, and wherein the leaker device includes a JFET device with shorted gate and drain terminals.

5. The voltage converter of claim 1 wherein the switch includes a MOSFET device, and wherein the leaker device includes a JFET device with a nominally floating JFET gate.

6. The voltage converter of claim 1 wherein the switch includes an enhancement mode MOSFET device, and wherein the leaker device includes a depletion mode MOSFET device.

7. The voltage converter of claim 1 wherein the switch includes a MOSFET device, and wherein the leaker device includes a JFET device, and further wherein the switch and the leaker device are vertical devices.

8. The voltage converter of claim 1, wherein:
    the switch includes a MOSFET device;
    the leaker device includes a JFET device;
    the gate of the MOSFET device is connected to the controller;
    the drain of the switch and the leaker device are connected together; and
    the source of the switch and the source of the leaker device are separated.

9. A voltage converter, comprising:
    a primary winding with a first terminal and a second terminal, the first terminal being coupled to a DC input voltage;
    a secondary winding electromagnetically coupled to the first winding;
    a controller electrically coupled to the secondary winding; and
    a semiconductor device comprising at least two types of cells on a single semiconductor substrate, the semiconductor device comprising a drain terminal coupled to the second terminal of the primary winding, a gate terminal coupled to the controller, and a first source terminal and a second source terminal coupled to the controller.

10. The voltage converter of claim 9 wherein at least two types of cells include one type of cells configured as a main switch of the converter and another type of cells configured as a current source to supply power to the controller during startup.

11. The voltage converter of claim 9, further comprising an encapsulant encapsulating the controller and semiconductor device into a same package.

12. A semiconductor device comprising two types of cells sharing a common drain and having two separate sources.

13. The semiconductor device of claim 12 wherein the two types of cells include a plurality of vertical DMOS cells and at least one integrated JFET cell.

14. The semiconductor device of claim 13 wherein the JFET cell has a gate and a source shorted with the gate.

15. The semiconductor device of claim 13 wherein the JFET cell has a nominally floating gate.

16. The semiconductor device of claim 12 wherein:
    the two types of cells include a plurality of vertical DMOS cells and at least one integrated JFET cell, the plurality of vertical DMOS cells and the at least one integrated JFET cell individually includes a body, a drain, and a gate;

the drains of the DMOS cells and the at least one JFET cell share a common layer of a first doping type at one side;

bodies of the DMOS cells and the gates of the at least one JFET cell are of a second doping type; and the sources of the DMOS cells and the at least one JFET cell are of the first doping type.

17. The semiconductor device of claim 12 wherein the two types of cells include a plurality of vertical DMOS cells and at least one integrated depletion-mode VDMOS cell.

18. A method for fabricating a semiconductor device, comprising:

forming an epitaxial layer of a first low doping type on a highly doped substrate as a drain of the semiconductor device;

growing a gate oxide and gate polysilicon layer on the epitaxial layer;

forming bodies of a plurality of DMOS cells and gates of a JFET cell of a second doping type;

forming sources of the DMOS cells in the bodies and the JFET cell of a first heavily doping type; and creating electrical short between the bodies and the sources of the VDMOS cells.

19. The method of claim 18 wherein forming sources of the DMOS cells in the bodies and the JFET cell includes forming source of the JFET cell at a central area of the JFET cell and forming the gate of the JFET cell at a periphery of the JFET cell.

20. The method of claim 18, further comprising:

forming an interlayer dielectric layer with deposition and patterning; and forming metal contacts.

* * * * *